United States Patent [19]

Siebold et al.

[11] Patent Number: 5,088,185
[45] Date of Patent: Feb. 18, 1992

[54] METHOD FOR MANUFACTURING GRADIENT COIL SYSTEM FOR A NUCLEAR MAGNETIC RESONANCE TOMOGRAPHY APPARATUS

[75] Inventors: Horst Siebold; Konrad Meier, both of Erlangen, Fed. Rep. of Germany

[73] Assignee: Siemens Aktiengesellschaft, Munich, Fed. Rep. of Germany

[21] Appl. No.: 643,369

[22] Filed: Jan. 22, 1991

Related U.S. Application Data

[62] Division of Ser. No. 442,211, Nov. 28, 1989, Pat. No. 5,012,191.

[30] Foreign Application Priority Data

Nov. 28, 1988 [EP] European Pat. Off. ........ 88119826.1

[51] Int. Cl.$^5$ .............................................. H01F 7/06
[52] U.S. Cl. ...................................... 29/605; 29/602.1
[58] Field of Search ............... 29/602.1, 605; 324/300, 324/307, 309, 310, 311, 312, 313, 318, 322; 128/653 A; 313/431, 437, 440, 426, 428; 335/299, 212, 213

[56] References Cited

U.S. PATENT DOCUMENTS

| | | | |
|---|---|---|---|
| 4,486,711 | 12/1984 | Frese et al. | 324/318 |
| 4,585,995 | 4/1986 | Flugan | 324/322 |
| 4,616,181 | 10/1986 | Kemme | 324/309 |
| 4,746,866 | 5/1988 | Roschmann | 324/318 |
| 4,878,024 | 2/1990 | Overweg | 324/319 |
| 4,904,975 | 2/1990 | Medenbach | 29/605 X |

FOREIGN PATENT DOCUMENTS

| | | |
|---|---|---|
| 0221810 | 5/1987 | European Pat. Off. . |
| 0243270 | 10/1987 | European Pat. Off. . |
| 0274149 | 7/1988 | European Pat. Off. . |
| 2170957 | 8/1986 | United Kingdom . |
| 2202333 | 9/1988 | United Kingdom . |

Primary Examiner—Timothy V. Eley
Attorney, Agent, or Firm—Hill, Van Santen, Steadman & Simpson

[57] ABSTRACT

A gradient coil system for a nuclear magnetic resonance tomography apparatus has a set of saddle coils disposed on a first cylindrical surface for generating the x-gradient, and a set of saddle coils disposed on a second, separate cylindrical surface for generating the y-gradient. The saddle coils in each set include three sub-coils having predetermined ampere turns, and formed by cable conductor wound exclusively by convex turns arranged in the same cylindrical surface. A middle coil of the three sub-coils has an arced portion facing the z=0 plane in an x-y-z coordinate system which approximates an arc of an ellipse.

1 Claim, 3 Drawing Sheets

METHOD FOR MANUFACTURING GRADIENT COIL SYSTEM FOR A NUCLEAR MAGNETIC RESONANCE TOMOGRAPHY APPARATUS

This is a division of application Ser. No. 442,211, filed Nov. 28, 1989, now U.S. Pat. No. 5,012,191.

BACKGROUND OF THE INVENTION

1. Field of the Invention

The present invention is directed to a gradient coil system suitable for use in a nuclear magnetic resonance tomography apparatus.

2. Description of the Prior Art

Gradient coil systems are required in nuclear magnetic resonance tomography devices for generating gradient fields in the x-direction ($G_x$) and in the y-direction ($G_y$) It is known to provide a hollow cylindrical carrier having a cylinder axis proceeding in the z-direction of a rectangular x-y-z coordinate system, with the origin of the coordinates disposed in the center of the imaging region. A fundamental magnetic field $B_z$ is also generated, which is oriented in the z-direction. It is known to provide a set of 4 saddle coils for generating the $G_x$ gradient and a separate set of saddle coils for $G_y$ gradient. Each saddle coil has straight conductor sections, connecting conductor arcs, with the straight conductor sections being oriented along the z-direction so that each saddle coil generates a gradient field in the same volume as the fundamental magnetic field. The straight conductor sections may be arranged in the winding bed of a carrier.

In nuclear magnetic resonance devices of this type, it is known that the fundamental magnetic field aligns the nuclear spins in an examination subject, such as a human body, and an RF system is provided for generating an RF field to excite nuclear spins in the examination subject, and to receive the resulting nuclear magnetic resonance signals. Gradient coils which proceed in the direction of the fundamental field generate a linearly changing magnetic field in this direction, and are required for the slice selection and for the spatial allocation of the signals in the slice. Further gradient coils similarly generate a magnetic field proceeding in the direction of the fundamental field but which changes in two directions perpendicular thereto. By selective excitation of these gradient coils, the phase of the RF signal can be influenced, so that an image of the slice plane of the examination subject can be derived based on the nuclear spin distribution.

A known nuclear magnetic resonance tomography device includes a system of gradient coils which simulate a hollow cylinder having a radius R, and having a cylinder axis proceeding in the z-direction of a rectangular x-y-z coordinate system having the coordinate origin in the center of the imaging region. The fundamental magnetic field $B_z$ also is oriented in this direction. At least two annular individual coils arranged symmetrically relative to the x-y plane, and oppositely traversed by current, are provided for generating a field gradient $G_z$, in the same direction as the fundamental field which is approximately constant in the imaging region. In this known system, further gradient coils are provided for generating the y-gradient $G_y$ and the x-gradient $G_x$. Respective sets of coils, each consisting of a set of 4 saddle-shaped coils, are provided for respectively generating these gradients. Each pair is respectively arranged symmetrically relative to the x-y plane, which is also the imaging plane of the tomogram to be produced. These saddle coils generate a field gradient in the x-direction $$G_x = \frac{\partial B_z}{\partial x}$$

which is substantially constant in the imaging region, and generate a corresponding field gradient in the y-direction $$G_y = \frac{\partial B_y}{\partial y}.$$

The saddle coils each contain straight conductor sections proceeding in the z-direction, and contain conductor arcs parallel to the x-y plane which extend around the circumference of an imaginary cylinder. The directions of current conduction in the adjacent straight conductor sections of the two individual coils of each coil pair are the same. The directions of the current, however, are opposite in the conductor sections arranged symmetrically relative to the x-y plane. The conductor arcs of the saddle coils facing toward the x-y plane are each divided so that a further conductor arc arises. The conductor arcs are arranged at predetermined distances from the x-y plane and the coupling between the conductor arcs increases with increasing distance from this plane. Such an arrangement is described in U.S. Pat. No. 4,486,711.

Given the use gradient coils in a nuclear magnetic resonance tomography apparatus for fast pulse sequences, the share of the higher audio frequencies from about 1 kHz through 10 kHz which is contained in the spectrum of the pulse sequences increases. To avoid both an increased power consumption and field distortions in this range due to the skin effect in solid conductors, stranded or cable conductors are used for the windings of the gradient coils. The individual saddles of a coil set of the gradient coils for a predetermined spatial coordinate must be connected to one another along short paths exhibiting low inductance. Because cable conductors contain individual wires insulated from each other, a solid block of solder, which can cause disturbing eddy currents, must be used to provide an electrical connection at the conductor ends.

Another known gradient coil system for use in a nuclear magnetic resonance tomography apparatus is described in European application 0 274 149. This known gradient coil system is arranged on a hollow cylindrical carrier having a cylinder axis proceeding in the z-direction of a rectangular coordinate system having the coordinate origin in the center of the imaging region. The fundamental magnetic field is also oriented in the z-direction. A coil set consisting of four saddle coils is provided for generating the x-gradient, and another set of four saddle coils is provided for generating the y-gradient. Each saddle coil consists of three sub-coils which are arranged on the same cylindrical surface. The conductor arc of the outer sub-coil and the conductor arc of the middle sub-coil proceed close to the symmetry plane z=0, whereas the conductor arc of the inner sub-coil is farther from this plane. One conductor arc of the middle sub-coil contains a concave curvature. This coil system can thus not be wound without substantial outlay.

SUMMARY OF THE INVENTION

It is an object of the present invention to provide a winding and circuit diagram for a gradient coil system having saddle coils which can be manufactured in a simple manner and which permits a plurality of pairs of saddle coils to be wound without intermediate contacts.

The above object is achieved in accordance with the principles of the present invention in a gradient coil system having a set of four saddle coils for generating the x-gradient and another set of four saddle coils for generating the y-gradient. Each coil set is arranged in a respectively different cylindrical surface, defined by a carrier member. The saddle coils in each set are each composed of three sub-coils, the sub-coils for the x-gradient being arranged in a first cylindrical surface, and the sub-coils for the y-gradient being arranged in a different cylindrical surface. The three sub-coils of each saddle coil are formed by a cable conductor and are exclusively wound with convex curvature. The arc conductors of the middle sub-coils facing toward the plane $z=0$ have a shape which approximates an arc of an ellipse.

In the gradient coil system disclosed herein, the individual saddle coils contain only rounded corners and only convex bends of a common flexible cable conductor. The individual saddle coils are preferably formed by sub-coils which are helically wound. The number of turns of these sub-coils is preferably in a ratio of 1:1:4 from the outer to the inner sub-coil.

The arrangement of the connecting lines of the individual saddle coils to one another is preferably such that the lead to one of the saddle coils provides a bifilar conductor arrangement which can be tapped. These conductor portions thus do not generate disturbing stray fields. The saddle coils for the x-gradient are preferably arranged in a further cylindrical plane having a slightly enlarged diameter, and can be offset by 90° relative to the coil set for the y-gradient in a known manner. The arrangement for the x-gradient is preferably selected so that the underpasses for the leads to the individual saddle coils are respectively situated at a location of the cylindrical surface at which a coil portion of the y-gradient is not present.

DESCRIPTION OF THE PREFERRED EMBODIMENTS

Figure 1:
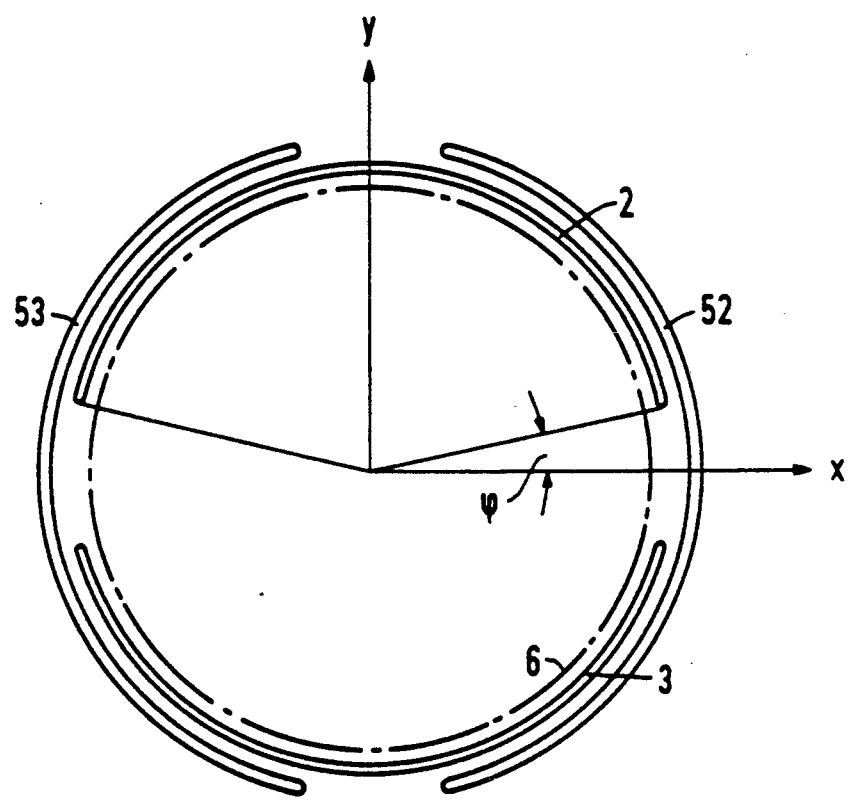
FIG. 1 is an end view, seen in the direction of the z-axis, of a gradient coil system for the x-gradient and for the y-gradient constructed in accordance with the principles of the present invention.

In the embodiment of gradient coil system shown in FIG. 1, each set of gradient coils for respectively generating the x-gradient and y-gradient consists of four saddle coils, with only two of those saddle coils being visible in FIG. 1. Two such saddle coils 2 and 3 can be seen in the drawing, which are part of the set of coils for generating the y-gradient $G_y$ in the direction of the y-axis of a rectangular coordinate system, on which the x-axis is also shown in FIG. 1. The saddle coils 2 and 3 are disposed opposite one another in the winding bend of a hollow cylindrical carrier member 6, indicated in dot-dash lines. The fundamental field of a nuclear magnetic resonance tomography apparatus in which the gradient coil system is to be used proceeds in the z-direction (i.e., in and out of the page) of this coordinate system. The conductors 2 and 3 are equidistantly spaced from the x-z plane, with the length of the arced portions of the saddle coils 2 and 3 being selected so that an angle $\Omega$ is formed with the x-z plane.

A gradient system for generating the x-gradient is also shown in FIG. 1, of which two coils 52 and 53 can be seen. The coils 52 and 53 are also wound in the winding bed of the carrier member 6. The coils 52 and 53 are wound on an imaginary cylindrical surface of the carrier member 6 which is slightly spaced from the imaginary cylindrical surface in which the coils 2 and 3 are wound. The spacing between the two different cylindrical surfaces is shown enlarged in FIG. 1 for clarity.

Figure 2:
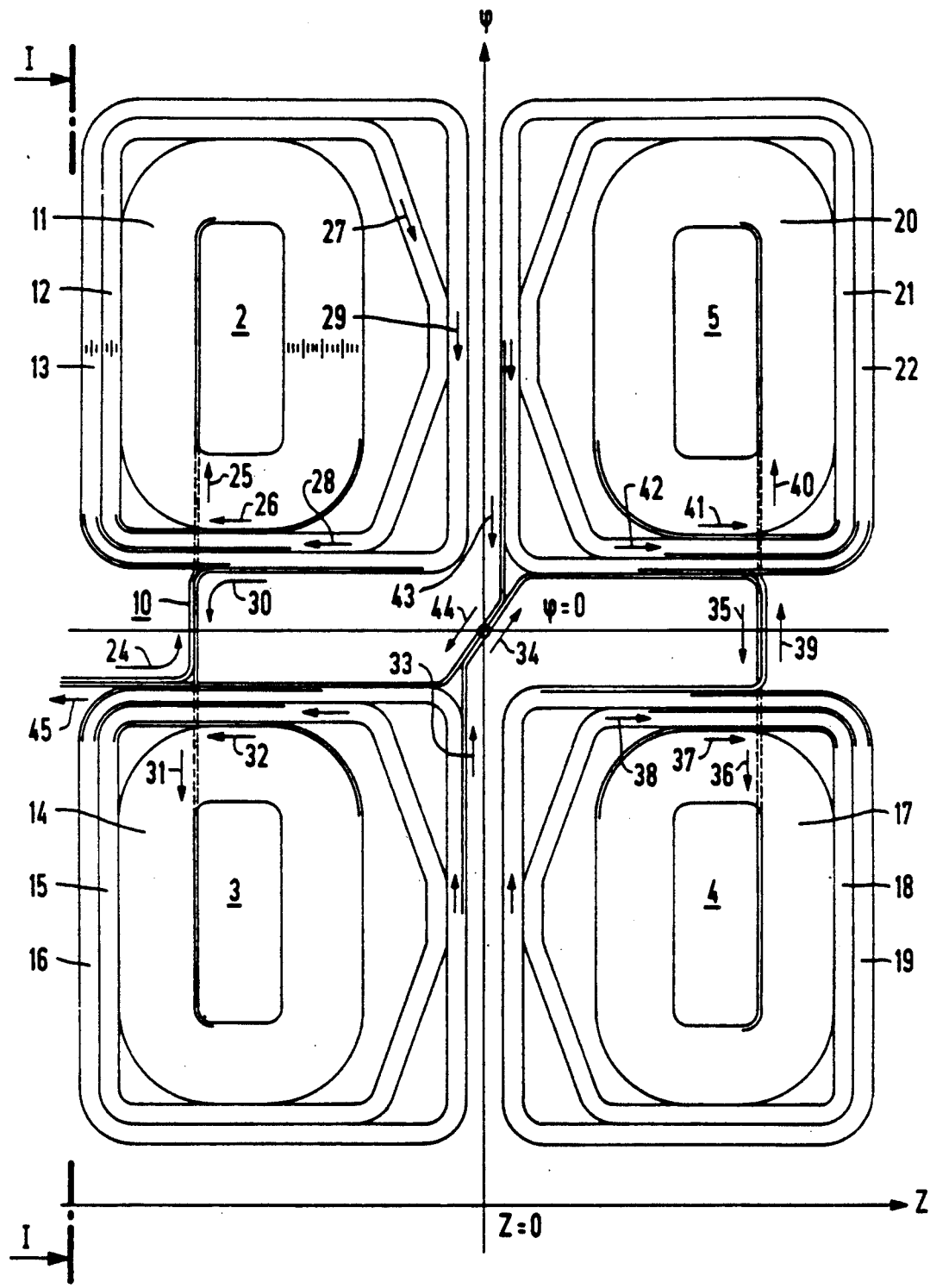
FIG. 2 is a plane view of the structure of the portion of the gradient coil system for generating the y-gradient constructed in accordance with the principles of the present invention using saddle coils.

The coil set for generating the y-gradient is shown in plan view in FIG. 2, in which the further saddle coils 4 and 5 can be seen in addition to the saddle coils 2 and 3. Each pair of saddle coils is arranged symmetrically relative to the plane $z=0$. This is also the imaging plane for the production of a tomogram.

In the following explanation of the arrangement of the cabled conductor 10 which forms the coils, the various positions of the common conductor 10 which forms the coils 2, 3, 4 and 5 are indicated only by directional arrows, which also represent the direction of the current when the gradient coils are operated. A feeder 24 of the conductor 10 is slightly offset from the plane $\Omega=0°$. The conductor 10 makes an underpass at the location 25, indicated by dot-dash lines, which can be achieved by an appropriate depression in the winding bed of the carrier 6. Following the underpass, the sub-coil 11 is wound which may, for example, consist of 16 turns, and which represents the inner sub-coil of the saddle coil 2. This coil is composed only of straight conductors in the z-direction, and of arced conductors in the circumferential direction of the carrier 6. The turns of the sub-coil 11 are all arranged in the same cylindrical surface of the carrier member 6. After completing the sub-coil 11, a further sub-coil 12 (the middle sub-coil) is formed having, for example, four turns beginning at position 26. The arced conductors of the sub-coil 12 are approximated by an arc of an ellipse at the location 27. These windings also lie in the same cylindrical surface.

After producing, for example, four turns, a transition to a new sub-coil 13, which may also have four turns, takes place at the position 28. The arced conductors of this sub-coil 13 facing toward the imaging plane $z=0$ have only a curvature in the circumferential direction of the carrier member 6 at the position 29.

After the production of the sub-coil 13, the conductor 10 is bent at the position 30 and is supplied to the saddle coil 3 via an underpass in the region of the position 31. The inner sub-coil 14 of the saddle coil 3 may also consist of 16 turns. At the position 32 after the completion of these 16 turns, a transition to a further sub-coil 15, which may have four turns, and to a sub-coil 16, which may also have four turns, occurs.

After the completion of the saddle coil 3, a tap is made at the location 33, and a transition occurs at the position 34 to the cylindrical surface of the carrier member 6 over the plane $\Omega=0°$ and the feed to the saddle coil 4 is undertaken at the position 35.

In the region of the position 36, the underpass of the conductor 10, in an appropriate depression of the winding bed of the carrier member 6 again shown with dot-dash lines, occurs. After the production of an inner sub-coil 17 having, for example, 16 turns, the transition is made to the second sub-coil 18, having four turns, at the position 37. Subsequently the transition to the sub-coil 19, which may also have four turns, occurs at the position 38. After the tap at the location 39, the feed to the saddle coil 5 is undertaken an underpass in the region of the location 40.

After the production of an inner sub-coil 20, the transition to the second sub-coil 21, having four turns, again occurs at the position 41, and subsequently the transition to the third sub-coil 22, which may also have four turns, takes place at the position 42.

After the production of the saddle coil 5 having its outer sub-coil 22, a tap at position 44 is made from the coil proceeding from position 43, and the return from the saddle coils 2–5 for the y-gradient is made at the position 45.

On a spherical surface having the standardized radius $r = R_a/R_G = 0.5$ of the radius of the carrier member 6, the embodiment of the saddle coils 2–5 produces distortions of the tomogram in the x-y plane of less than 1%. Extremely low disturbances of B (5,5) = −0.27% and B (7,1) = 0.1% arise by rounding the calculated values to the whole numbers of turns.

In this embodiment of the saddle coils 2–5 for the y-gradient, addition disturbing fields cannot arise either at the feed and tap at the positions 24 or 25, nor due to the connecting lines at the positions 33 and 34 and at 35 and 39, because there is antiparallel (i.e., opposite direction) current conduction. Due to the winding of the four saddle coils 2–5 from a common cable conductor 10, losses due to eddy currents in solid conductor connections are not generated. Because the sub-coils of the saddle coils 2–5 are only composed of straight conductors and arc conductors having the same curvature, and since the arc of the sub-coils 12, 15, 18 and 21 facing toward the imaging plane can be calculated by the approximation of an ellipse, both a simple calculation and a simple manufacture of these saddle coil pairs result.

Figure 3:
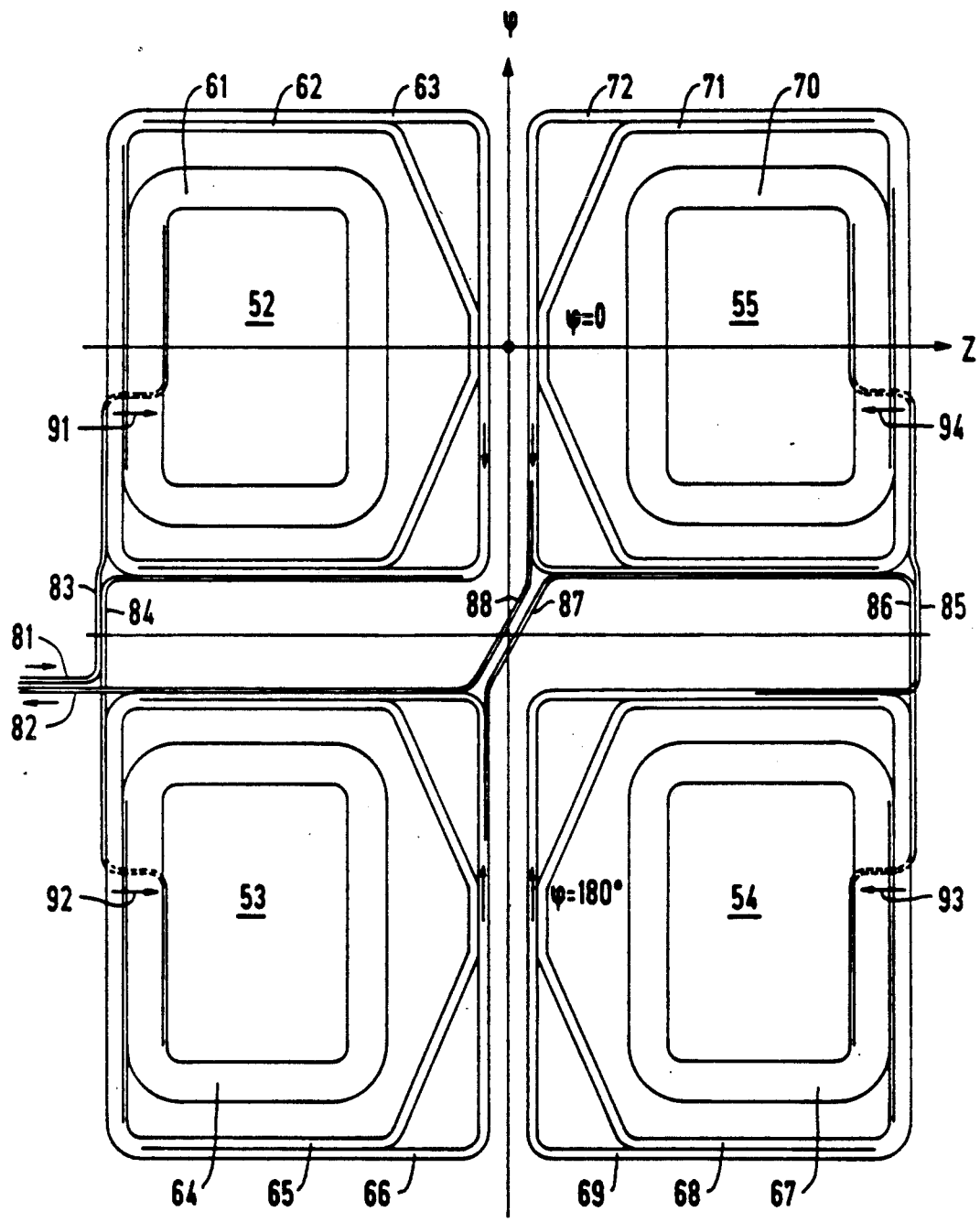
FIG. 3 is a plane view of the structure of the portion of the gradient coil system for generating the x-gradient constructed in accordance with the principles of the present invention using saddle coils.

As shown in FIG. 3, two further saddle coils 54 and 55 are provided for generating the x-gradient in additional to the saddle coils 52 and 53. The saddle coils 52–55 each consist of three sub-coils, the totality of sub-coils be referenced 61–72 in FIG. 3. The windings proceed as described in detail above in connection with the coils for generating the y-gradient. As can be seen in FIG. 3, the feeder 81 and the return 82, as well as the connecting lines between the coils at 83 and 84, 85 and 86, and 87 and 88 are bifilarly arranged with oppositely directed current conduction. The underpass of the feeder to the inner sub-coils 61, 64, 67 and 70 is undertaken at respective locations 91, 92, 93 and 94 on the circumference of the carrier member 6 at or in the proximity of the plane $\Omega=0°$ at which the gradient coils 2 and 3 for the y-gradient are not present. Only a single additional cylindrical surface on the carrier member 6, whose diameter is not significantly larger than the diameter for coil system consisting of the saddle coils 2–5 for the y-gradient, is thereby required for the saddle coils 52–55 for the x-gradient. This is of particular advantage because the reactive power consumption of the gradient coils increases with the fifth power of the radius.

A common hollow cylindrical carrier member 6 is described above as being provided for the two sets of gradient coils. It is also possible, however, to provide a separate carrier member under certain conditions for each of the two coil sets.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for manufacturing a gradient coil system for use in a nuclear magnetic resonance tomography apparatus, with reference to an x-y-z coordinate system, said method comprising the steps of:
    winding a first set of four saddle coils on a cylindrical surface by winding a cable conductor exclusively with convex curvature on said surface to form, for each of said four saddle coils, three sub-coils; and
    within said three sub-coils, forming a middle coil having an arced portion, facing the z=0 plane, which approximates an arc of an ellipse.

* * * * *